United States Patent
Li et al.

(10) Patent No.: US 8,018,296 B2
(45) Date of Patent: Sep. 13, 2011

(54) PRINTED CIRCUIT BOARD HAVING A PLURALITY OF ANGLED DIFFERENTIAL PAIRS OF TRANSMISSION LINES

(75) Inventors: Cheng-Shien Li, Taipei Hsien (TW); Yung-Chieh Chen, Taipei Hsien (TW); Shou-Kuo Hsu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 250 days.

(21) Appl. No.: 12/205,146

(22) Filed: Sep. 5, 2008

(65) Prior Publication Data

US 2010/0007429 A1 Jan. 14, 2010

(30) Foreign Application Priority Data

Jul. 8, 2008 (CN) .......................... 2008 1 0302663

(51) Int. Cl.
*H01P 3/08* (2006.01)
(52) U.S. Cl. ......................................................... 333/5
(58) Field of Classification Search .................. 333/5, 4, 333/1, 24 R
See application file for complete search history.

(56) References Cited

U.S. PATENT DOCUMENTS

| 5,414,393 | A  | * | 5/1995  | Rose et al. ................. 333/1 |
| 6,573,801 | B1 |   | 6/2003  | Marketkar et al. |
| 6,576,847 | B2 | * | 6/2003  | Marketkar et al. ........... 174/255 |
| 6,611,181 | B2 | * | 8/2003  | Marketkar et al. ........... 333/24 R |
| 2004/0239438 | A1 | * | 12/2004 | Benham et al. ............. 333/24 R |
| 2007/0159271 | A1 | * | 7/2007  | Kuylenstierna .............. 333/161 |

FOREIGN PATENT DOCUMENTS

CN 1486640 A 3/2004

* cited by examiner

*Primary Examiner* — Benny Lee
(74) *Attorney, Agent, or Firm* — Altis Law Group, Inc.

(57) ABSTRACT

A printed circuit board includes a plurality of differential pairs arranged thereon side-by-side. Each differential pair includes two transmission lines. Each transmission line includes a plurality of sections of equal length. Every two adjacent sections in each transmission line meet at an angle, and all angles are equal. The length of each section is determined by dividing the distance between two corresponding angles of the two transmission lines of each differential pair by the cosine of half of the angle.

5 Claims, 3 Drawing Sheets

PRINTED CIRCUIT BOARD HAVING A PLURALITY OF ANGLED DIFFERENTIAL PAIRS OF TRANSMISSION LINES

BACKGROUND

1. Field of the Invention

The present invention relates to a printed circuit board and a method for routing the printed circuit board.

2. Description of the Related Art

A printed circuit board (PCB) needs an insulating base material to avoid shorting circuits on the PCB. The insulating material must be strong enough to protect copper tracks placed upon it. A widely used PCB base material is glass fabric, which absorbs little moisture, has great strength and stiffness, and is highly flame-resistant. However, glass fabric has a low transmission quality of differential signals transmitted on the PCB caused by gaps between the thin fiber strips of the glass fabric.

What is needed, therefore, is a PCB to overcome the above-described shortcoming.

DETAILED DESCRIPTION OF THE EMBODIMENTS

Figure 1:
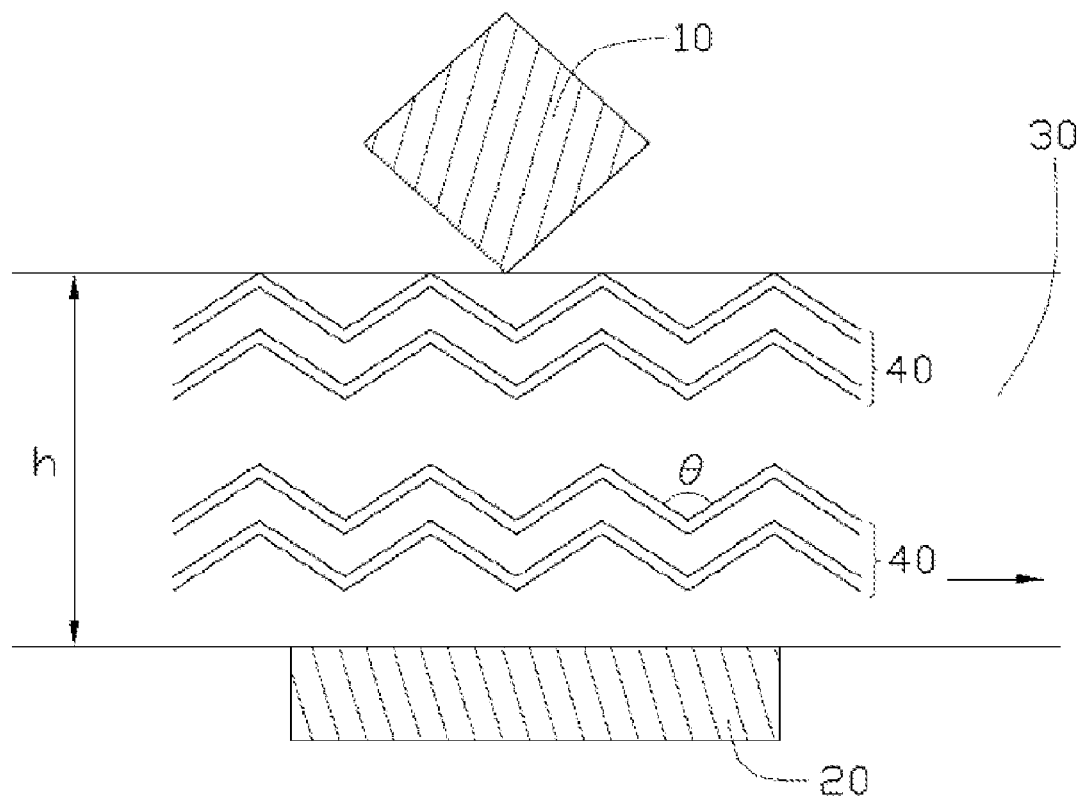
FIG. 1 is a schematic view of an embodiment of a PCB, the PCB including a plurality of differential pairs.

Referring to FIG. 1, an embodiment of a printed circuit board includes a first area 10, a second area 20, a third area 30 located between the first and second areas 10, 20, and a plurality of differential pairs 40 arranged in the third area 30 side-by-side. The first and second areas 10, 20 are not in communication with the differential pairs 40. The third area 30 is a routing area formed by a first straight line (not labeled) and a second straight line (not labeled). The first straight line and the first area 10 intersect at a point. The second straight line is superposed with an inner side of the second area 20.

A routing direction of each differential pair 40 is parallel to the first straight line and the second straight line as shown by an arrow in FIG. 1. Each differential pair 40 includes two transmission lines. Each transmission line includes a plurality of sections of equal length. Every two adjacent sections in each transmission line meet at an angle $\theta$. The angle $\theta$ is between 0° and 180°. All of the angles $\theta$ are equal.

Figure 2:
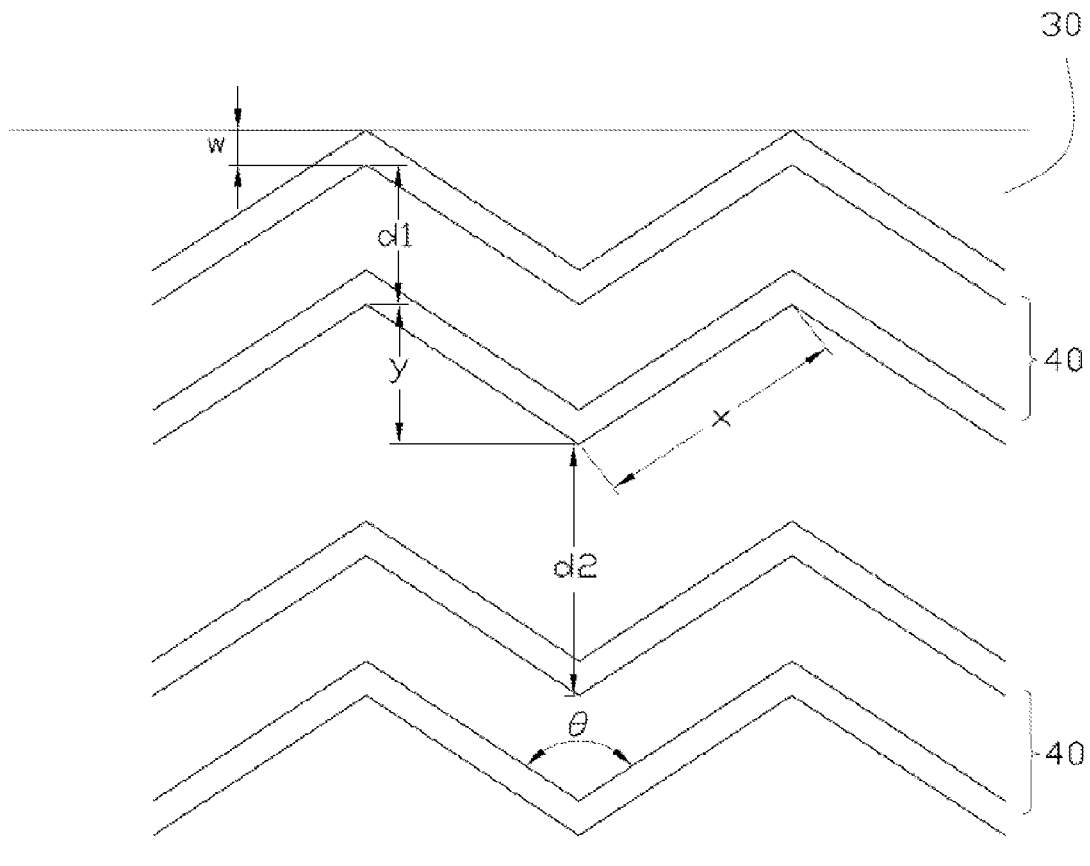
FIG. 2 is an enlarged view of the differential pairs of the PCB of FIG. 1.

Referring also to FIG. 2, a maximum number n of the plurality of differential pairs 40 arranged in the third area 30 are obtained according to equation (1) below:

$$n=[(h-y-w+d2)/(d1+d2)] \quad (1)$$

where:

h is a shortest distance between the first straight line and the second straight line; y is a shortest distance between every two adjacent angles $\theta$ of each transmission line determined according to equation (2)

$$y=x*\cos(\theta/2), \quad (2)$$

where x is a length of each section;

w is a width of each transmission line as shown in FIG. 1 along a direction perpendicular to the routing direction;

d1 is a distance between the two transmission lines of each differential pair 40; and d2 is a distance between every two adjacent differential pairs 40.

For exemplary purposes only, a sum of a distance between the two transmission lines of the differential pair is about 11.5 to about 12 mils, and the width of each transmission line is about 4 to about 5 mils. Without changing these parameters of the differential pair, each transmission line may be bent into a plurality of sections. Therefore, the value of d1 is about 11.5 to about 12 mils, and the value of w is about 4 to about 5 mils. The length of each section may be adjusted to ensure that both of the two transmission lines of each differential pair are located on the glass fiber strips of the base material of the PCB, instead of one transmission line of a differential pair located on a gap between the glass fiber strips, while another transmission line is located on the glass fiber strips.

A typical width of each gap between the glass fiber strips of a common glass fabric is about 10 to about 20 mils. If the differential pair 40 is located on the glass fabric, the length x of each section may be adjusted to ensure that the shortest distance between every two adjacent angles $\theta$ of each transmission line is greater than or equal to the distance between two corresponding angles of the two transmission lines of each differential pair, and specifically, to ensure that y is greater than or equal to d1. In one embodiment, y may be equal to d1 instead of being greater than d1 to save space within each differential pair. Thus, a total width W of each differential pair 40 in the third area 30 is about 27 to about 29 mils, according the following equation:

$$W=2d1+w$$

As the width of a gap between the glass fiber strips becomes less than the total width W of each differential pair 40, and the shortest distance between every two adjacent angles $\theta$ of each transmission line becomes substantially equal to the distance between two corresponding angles of the two transmission lines of each differential pair 40, both of the two transmission lines of each differential pair 40 will be located on the glass fiber strips of the base material of the PCB. Noise from the transmission lines of the differential pairs 40, caused by gaps between the glass fiber strips of the PCB base material, is avoided.

Figure 3:
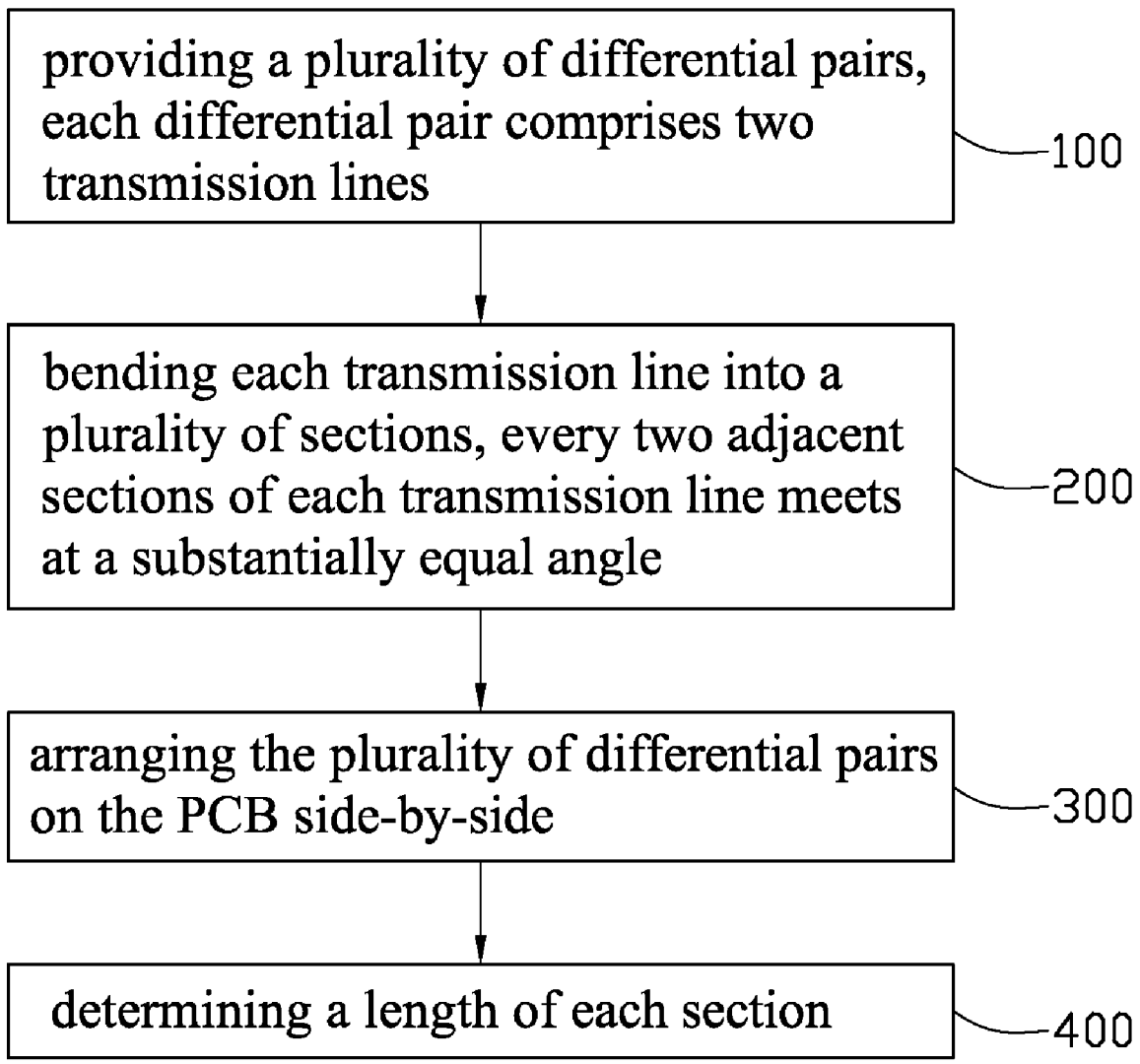
FIG. 3 is a flowchart illustrating a method for routing the PCB of FIG. 1.

Referring to FIG. 3, is a method for routing the PCB of FIG. 1. Depending on the embodiment, certain of the steps described below may be removed, others may be added, and the sequence of steps may be altered.

Step 100: providing a plurality of differential pairs, each differential pair comprises two transmission lines.

Step 200: bending each transmission line into a plurality of sections, every two adjacent sections of each transmission line meets at a substantially equal angle.

Step 300: arranging the plurality of differential pairs in the routing area of the PCB side-by-side.

Step 400: determining a length of each section by dividing the distance between two corresponding angles of the two transmission lines of each differential pair by the cosine of half of the angle.

The embodiments are chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A printed circuit board comprising:
    a routing area on one side of the printed circuit board; and
    a plurality of differential pairs arranged in the routing area side-by-side and being coplanar to each other;
    wherein each differential pair comprises two transmission lines arranged side-by-side, each transmission line comprises a plurality of sections of equal length, and each section of one of the two transmission lines is parallel with a corresponding section of the other one of the two transmission lines, every two adjacent sections of each transmission line meet at a substantially equal angle, and the length of each section is determined by dividing the distance between two corresponding angles of the every two adjacent transmission lines of each differential pair by the cosine of half of the angle.

2. The printed circuit board of claim 1, further comprising:
    a first area being not in communication with the plurality of differential pairs; and
    a second area being not in communication with the plurality of differential pairs;
    wherein the routing area is positioned between the first area and the second area.

3. The printed circuit board of claim 2, wherein the routing area is defined by a first straight line and a second straight line running parallel to routing directions of the differential pairs, the first straight line meets an inner side of the first area at an intersection, the second straight line is superposed with an inner side of the second area.

4. A method for routing a printed circuit board, the method comprising:
    forming a routing area on a side of the printed circuit board;
    providing a plurality of differential pairs arranged in the routing area side-by-side, each differential pair comprises two transmission lines arranged side-by-side;
    bending each transmission line into a plurality of sections, each section of one of the two transmission lines is parallel with a corresponding section of the other one of the two transmission lines, every two adjacent sections of each transmission line meets at a substantially equal angle;
    arranging the plurality of differential pairs in the routing area side-by-side and to be coplanar to each other;
    determining a length of each section by dividing the distance between two corresponding angles of the two transmission lines of each differential pair by the cosine of half of the angle.

5. The method of claim 4, wherein the routing area is defined by a first straight line and a second straight line running parallel to a routing direction of the differential pairs.

* * * * *